(12) United States Patent
Gluschenkov et al.

(10) Patent No.: US 8,237,278 B2
(45) Date of Patent: Aug. 7, 2012

(54) CONFIGURABLE INTERPOSER

(75) Inventors: Oleg Gluschenkov, Hopewell Junction, NY (US); Yunsheng Song, Hopewell Junction, NY (US); Tso-Hui Ting, Hopewell Junction, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 333 days.

(21) Appl. No.: 12/619,002

(22) Filed: Nov. 16, 2009

(65) Prior Publication Data

US 2011/0115082 A1    May 19, 2011

(51) Int. Cl.
 *H01L 23/48*    (2006.01)
(52) U.S. Cl. ......... 257/738; 257/E23.011; 257/E21.521; 257/774; 438/14; 438/113
(58) Field of Classification Search .......... 257/738, 257/E21.521, E23.011; 438/14, 113
See application file for complete search history.

(56) References Cited

U.S. PATENT DOCUMENTS

| | | | |
|---|---|---|---|
| 5,915,167 A | 6/1999 | Leedy | |
| 6,133,640 A | 10/2000 | Leedy | |
| 6,208,545 B1 | 3/2001 | Leedy | |
| 6,551,857 B2 | 4/2003 | Leedy | |
| 6,563,224 B2 | 5/2003 | Leedy | |
| 6,632,706 B1 | 10/2003 | Leedy | |
| 6,741,085 B1 | 5/2004 | Khandros et al. | |
| 6,979,905 B2 | 12/2005 | Nishida et al. | |
| 7,138,295 B2 | 11/2006 | Leedy | |
| 7,193,239 B2 | 3/2007 | Leedy | |
| 7,291,910 B2 | 11/2007 | Khandros et al. | |
| 7,291,929 B2 | 11/2007 | Tanaka et al. | |
| 7,327,038 B2 | 2/2008 | Kwon et al. | |
| 7,400,157 B2 | 7/2008 | Grube et al. | |
| 7,474,004 B2 | 1/2009 | Leedy | |
| 7,504,732 B2 | 3/2009 | Leedy | |
| 7,705,466 B2 | 4/2010 | Leedy | |
| 7,838,337 B2 * | 11/2010 | Marimuthu et al. | .......... 438/110 |
| 2002/0132465 A1 | 9/2002 | Leedy | |
| 2003/0173608 A1 | 9/2003 | Leedy | |
| 2007/0050738 A1 | 3/2007 | Dittmann | |
| 2008/0253098 A1 | 10/2008 | Liu | |
| 2008/0288908 A1 | 11/2008 | Hart et al. | |

(Continued)

FOREIGN PATENT DOCUMENTS
CN    1525485    4/1998
(Continued)

*Primary Examiner* — Evan Pert
*Assistant Examiner* — Krista Soderholm
(74) *Attorney, Agent, or Firm* — Scully, Scott, Murphy & Presser, P.C.; Wenjie Li, Esq.

(57) ABSTRACT

A modularized interposer includes a plurality of interposer units that are assembled to provide a complete set of electrical connections between two semiconductor chips. At least some of the plurality of interposer units can be replaced with other interposer units having an alternate configuration to enable selection of different functional parts of semiconductor chips to be connected through the modularized interposer. Bonding structures, connected to conductive metal pads located at peripheries of neighboring interposer units and an overlying or underlying portion of a semiconductor chip, can provide electrical connections between the neighboring interposer units. The interposer units can be provided by forming through-substrate vias (TSV's) in a substrate, forming patterned conductive structures on the substrate, and cutting the substrate into interposers.

11 Claims, 15 Drawing Sheets

| U.S. PATENT DOCUMENTS | | |
|---|---|---|
| 2009/0067210 A1 | 3/2009 | Leedy |
| 2009/0174082 A1 | 7/2009 | Leedy |
| 2009/0175104 A1 | 7/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |

| FOREIGN PATENT DOCUMENTS | | |
|---|---|---|
| CN | 101188235 | 4/1998 |
| CN | 98803836 | 6/2004 |
| EP | 0975472 | 4/1998 |
| EP | 1986233 | 4/1998 |
| JP | 10-543031 | 4/1998 |
| JP | 2008028407 | 8/2007 |
| JP | 2008166831 | 7/2008 |
| JP | 2008166832 | 7/2008 |
| JP | 2008172254 | 7/2008 |
| KR | 10-0639752 | 10/2006 |
| KR | 10-0785821 | 12/2007 |
| TW | 412854 | 11/2000 |

* cited by examiner

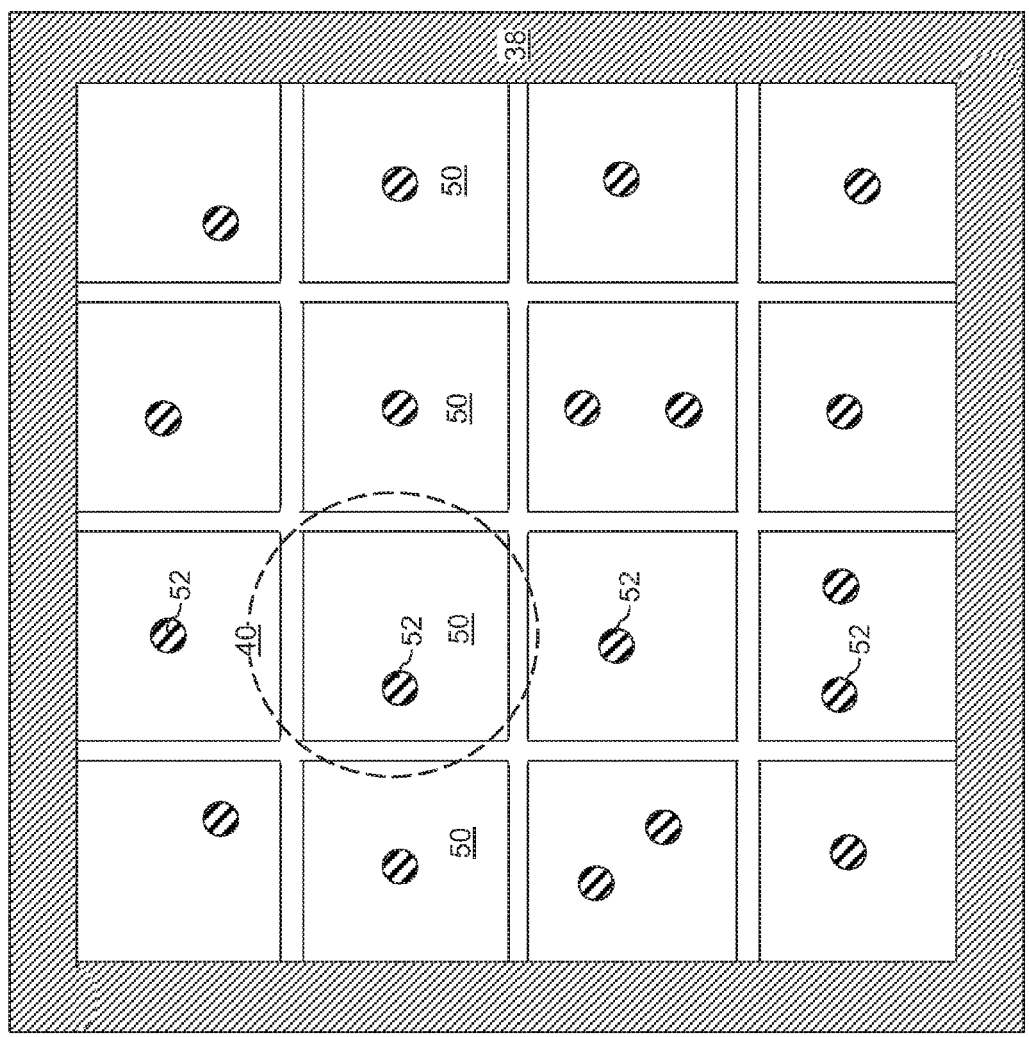

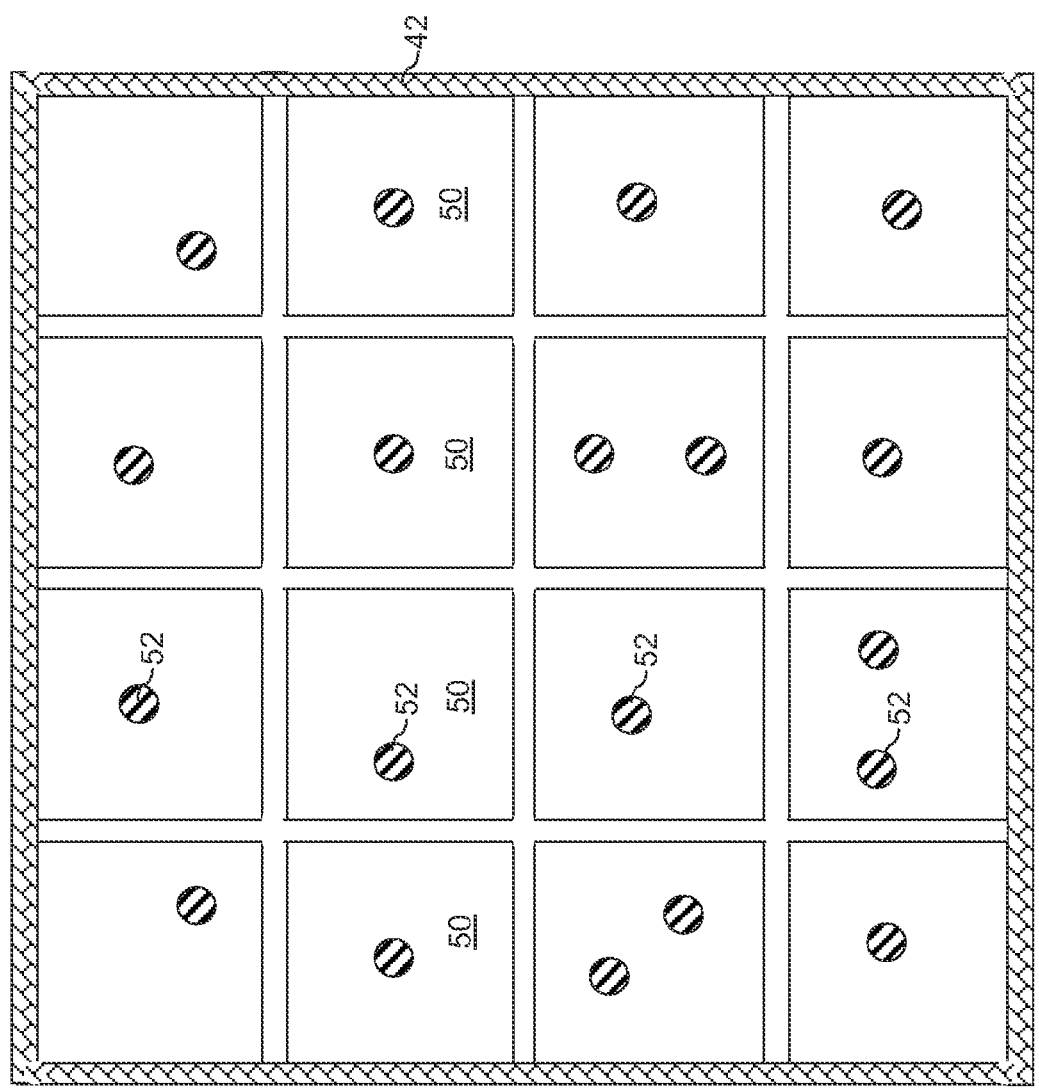

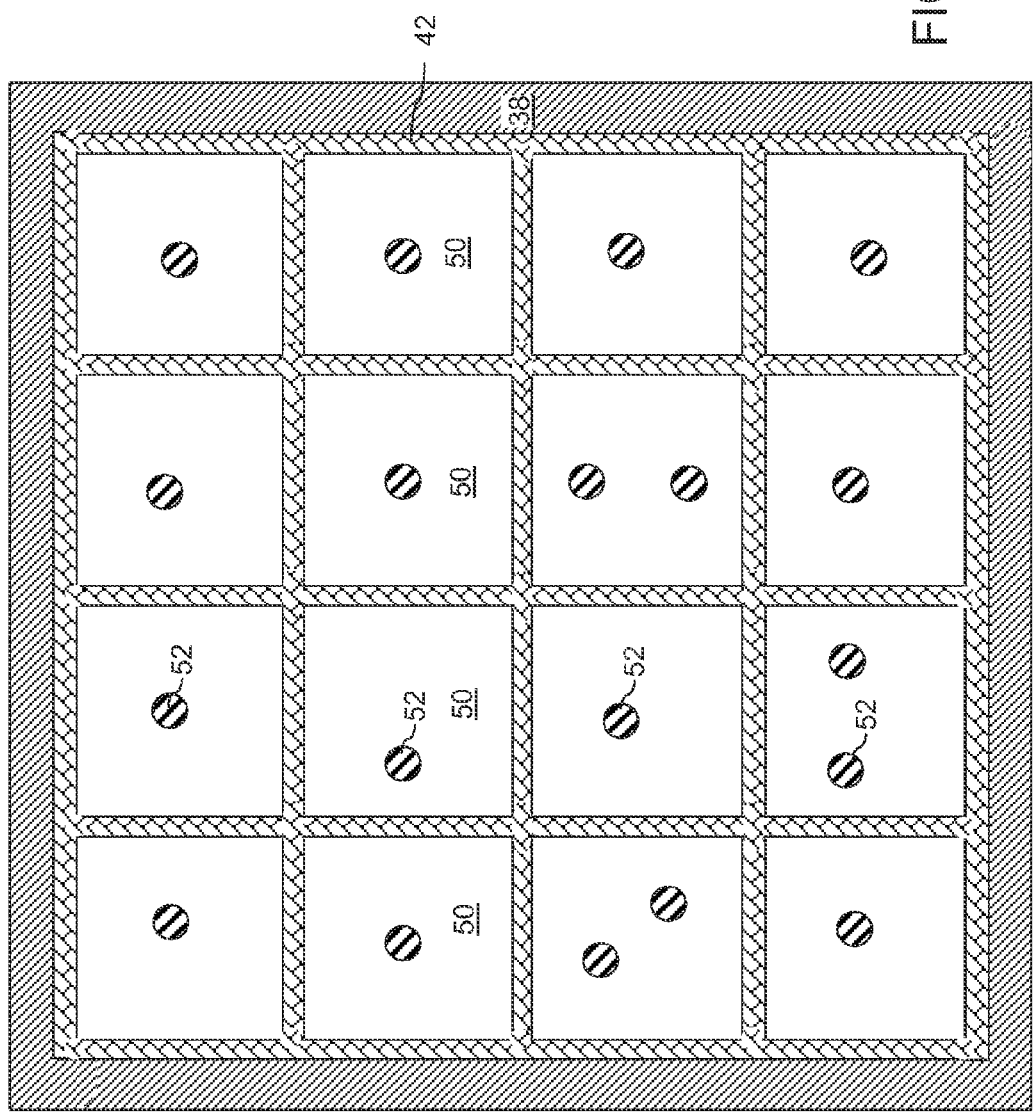

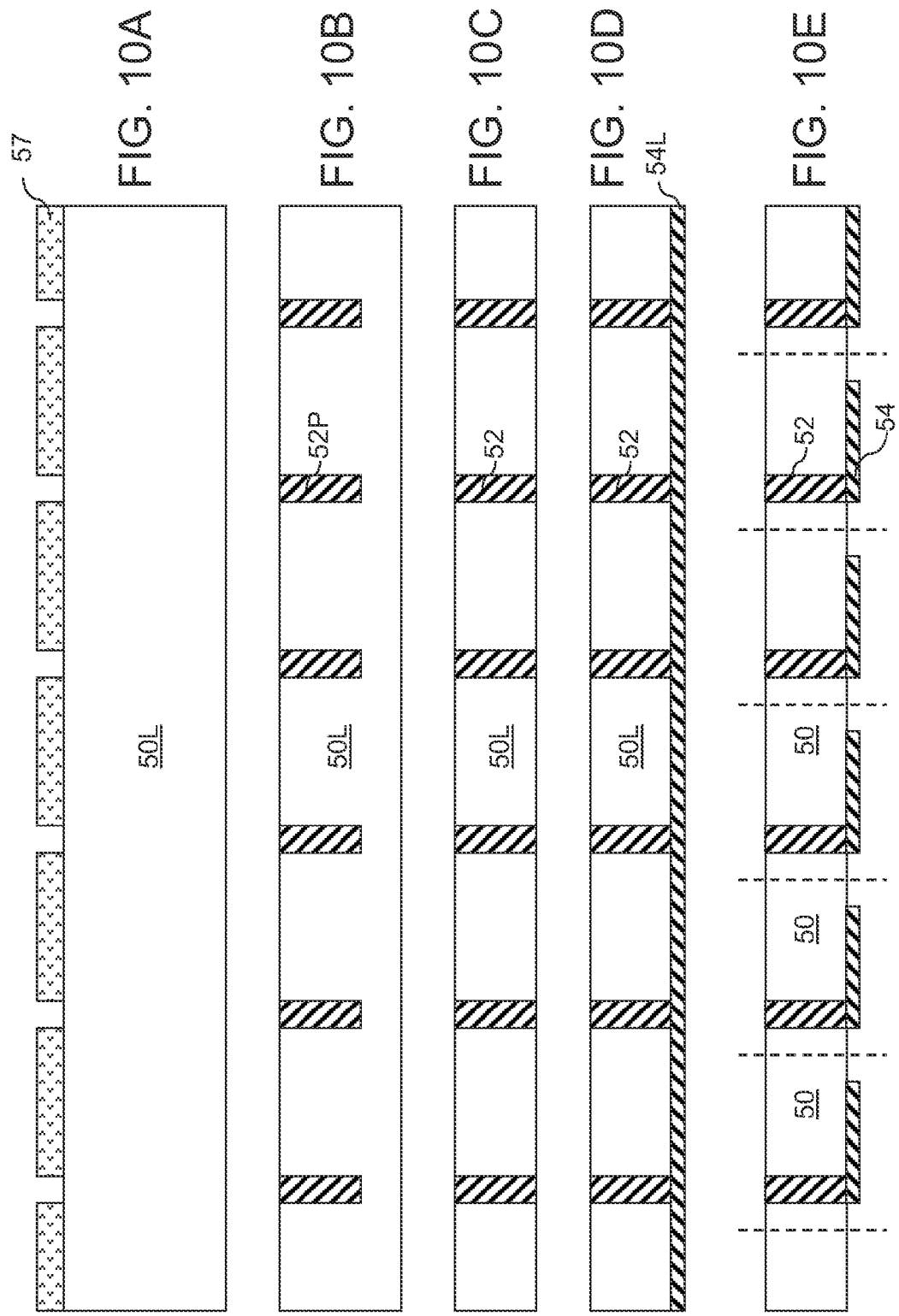

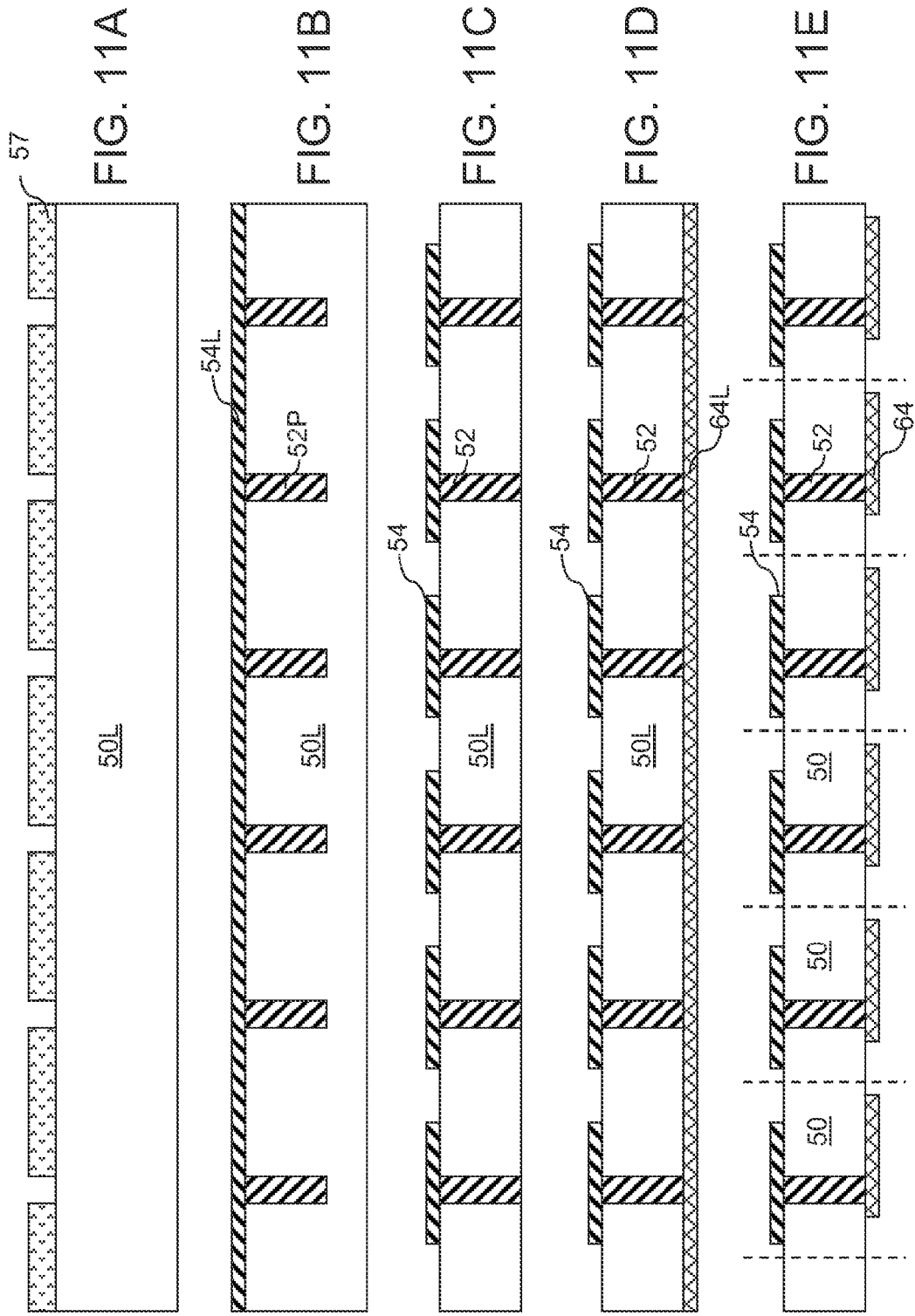

US 8,237,278 B2

CONFIGURABLE INTERPOSER

BACKGROUND

The present invention relates to the field of semiconductor structures, and particularly to a configurable interposer that modifies electrical connections between two semiconductor chips, methods of manufacturing the same, and methods of operating the same.

Interposers can be employed to provide electrical connections between multiple semiconductor chips. Interposers can provide customized electrical connections between semiconductor chips when it is necessary to electrically connect two types of semiconductor chips to provide a functionality that is not provided by a single semiconductor chip. Thus, specific functional features of each semiconductor chip can be selected for integration with functional features of other semiconductor chips connected to the same interposer. Further, electrical connections between selected portions of semiconductor chips can be made while disabling other portions of semiconductor chips when multiple semiconductor chips are connected employing an interposer.

While interposers allow selection of functional features and electrical connections to be enabled when multiple semiconductor chips are stacked, the overall functionality of the stacked structure depends on the functionality of individual functional components within each semiconductor chip. The yield of a semiconductor structure employing an interposer depends on the yield of individual semiconductor chips and the yield of the interposer. Use of an interposer as known in the industry does not provide a method of compensating for a depressed yield in individual components or modules of semiconductor chips.

BRIEF SUMMARY

According to an embodiment of the present invention, a modularized interposer includes a plurality of interposer units that are assembled to provide a complete set of electrical connections between two semiconductor chips. At least some of the plurality of interposer units can be replaced with other interposer units having an alternate configuration to enable selection of different functional parts of semiconductor chips to be connected through the modularized interposer. Bonding structures, connected to conductive metal pads located at peripheries of neighboring interposer units and an overlying or underlying portion of a semiconductor chip, can provide electrical connections between the neighboring interposer units. The interposer units can be provided by forming through-substrate vias (TSV's) in a substrate, forming patterned conductive structures on the substrate, and cutting the substrate into interposers.

According to an aspect of the present invention, a semiconductor structure includes an array of interposer units. Each interposer unit in the array is conductively connected to a first semiconductor chip and a second semiconductor chip, and each interposer unit in the array is not of integral construction with any other interposer unit in the array.

According to another aspect of the present invention, a method of forming a semiconductor structure is provided. The method includes forming an array of interposer units by selecting an interposer unit in the array from a set of at least two interposer units, wherein each of the at least two interposer units is configured to fit into a same space in the array and provide different configurations in electrical connections therethrough; and bonding a first semiconductor chip and a second semiconductor chip to the array of interposer units.

According to yet another aspect of the present invention, a method of forming an array of interposer units is provided. The method includes forming a plurality of through-substrate via (TSV) structures in a substrate; forming a plurality of conductive metal lines contacting a TSV structure on one side of the substrate; dicing the substrate to form a plurality of interposer units; and placing some of the plurality of interposer units in proximity to one another to form an array of interposer units.

BRIEF DESCRIPTION OF THE SEVERAL VIEWS OF THE DRAWINGS

FIG. 1B is a horizontal cross-sectional view of the first exemplary structure in the plane B-B' in FIG. 1A according to the first embodiment of the present invention.

FIG. 2B is a horizontal cross-sectional view of the second exemplary structure in the plane B-B' in FIG. 2A according to the second embodiment of the present invention.

FIG. 3B is a horizontal cross-sectional view of the third exemplary structure in the plane B-B' in FIG. 3A according to the third embodiment of the present invention.

FIGS. 10A-10E are sequential vertical cross-sectional views of an eighth exemplary structure according to a tenth embodiment of the present invention.

FIGS. 11A-11E are sequential vertical cross-sectional views of a ninth exemplary structure according to an eleventh embodiment of the present invention.

DETAILED DESCRIPTION

Figure 1A:
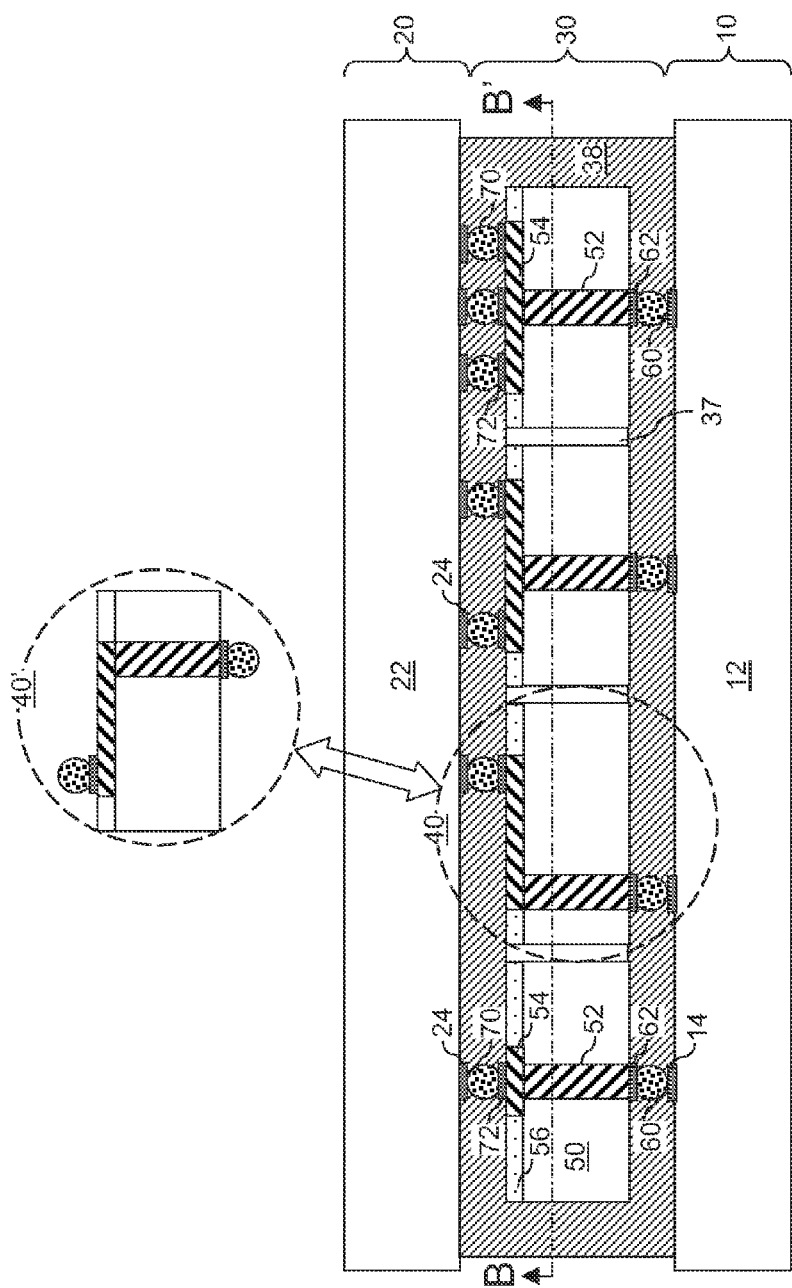
FIG. 1A is a vertical cross-sectional view of a first exemplary structure according to a first embodiment of the present invention.

As stated above, the present invention relates to semiconductor structures, and particularly to a configurable interposer that modifies electrical connections between two semiconductor chips, methods of manufacturing the same, and methods of operating the same, which are now described in detail with accompanying figures. Throughout the drawings, the same reference numerals or letters are used to designate like or equivalent elements. The drawings are not necessarily drawn to scale.

As used herein, a "through-substrate via (TSV) structure" is a conductive structure that extends through a substrate, i.e., at least from a top surface of the substrate to a bottom surface of the substrate.

As used herein, two elements are "conductively connected" to each other if there exists a conductive path between the two elements to allow conduction of electricity.

As used herein, a first element "encapsulates" a second element if all outer surfaces of the second element is located within inner surfaces of the first element.

Referring to FIGS. 1A and 1B, a first exemplary structure according to a first embodiment of the present invention includes a first semiconductor chip 10, a second semiconductor chip 20, and a bonding assembly structure 30 that provides bonding between the first substrate 10 and the second substrate 20. The first semiconductor chip 10 includes a first semiconductor substrate 12 and first contact pads 14 located on an upper surface of the semiconductor substrate 12. The second semiconductor chip 20 includes a second semiconductor substrate 22 and second contact pads 24 located on a lower surface of the semiconductor substrate 22. Each of the first and second semiconductor substrates (12, 22) can include at least one semiconductor device such as a field effect transistor, a bipolar transistor, a thyristor, or a diode.

The bonding assembly structure 30 provides electrical connection between the first semiconductor chip 10 and the second semiconductor chip 20. The bonding assembly structure 30 contacts the upper surface of the first semiconductor chip 10 and the lower surface of the second semiconductor chip 20. Specifically, conductive components within the bonding assembly structure 30 contacts the first contact pads 14 and the second contact pads 24.

The bonding assembly structure 30 includes an array of interposer units 40. At least one interposer unit 40 in the array is conductively connected to the first semiconductor chip 10 and the second semiconductor chip 20. All of the interposer units 40 in the array can provide conductive electrical connections to the first and second semiconductor chips (10, 20). Alternately, some of the interposer units 40 in the array can provide conductive electrical connections to the first and second semiconductor chips (10, 20), i.e., some interposer units 40 may not be connected to the first and/or second semiconductor chips (10, 20). Each interposer unit 40 in the array is a distinct structure that is not part of another interposer unit 40. In other words, each interposer unit 40 is not of integral construction with any other interposer unit in the array.

Each interposer unit 40 includes an interposer substrate 50 and at least one through-substrate via (TSV) structure 52. A TSV structure 52 is a conductive structure that extends at least through an interposer substrate 50. Each TSV structure 52 is embedded in an interposer substrate 50. The interposer substrate 50 can include a dielectric material, a semiconducting material, or a conductive material. In case the interposer substrate 50 includes a semiconductor material or a conductive material, a dielectric liner (not shown) is provided around each of the TSV structures 52 to electrically isolate each TSV structure 52 from the interposer substrate 50 that embeds the TSV structure 52. Each interposer unit 40 can include no more than one TSV structure 52 or at least two TSV structures 52.

Each interposer unit 40 can include at least one upper contact pad 72 located on one side of the interposer substrate 50 and a lower contact pad 62 located on another side of the interposer substrate 50. Each interposer unit 40 can include at least one conductive metal line 54 contacting one end of a TSV structure 52 and one of the upper contact pads 72 and the lower contact pads 62. The conductive metal lines 54 can be embedded in a dielectric material layer 56.

All interposer units 40 in the array can have a coplanar top surface and a coplanar bottom surface. The coplanar top surface can be the top surface of the dielectric material layer 56, which can coincide with a bottom surface of the upper contact pads 72. The coplanar bottom surface can be the bottom surface of the interposer units 40, which can be coplanar with upper surfaces of the lower contact pads 62.

The bonding assembly structure 30 can include an array of first solder balls 60 and an array of second solder balls 70. Each of the first solder balls 60 contacts a lower contact pad 62 of an interposer unit 40 and a first contact pad 14 of the first semiconductor chip 10. Each of the second solder balls 70 contacts an upper contact pad 72 of an interposer unit 40 and a second contact pad 24 of the second semiconductor chip 20.

The bonding assembly structure 30 can further include a molding compound structure 38 located between the first and second semiconductor chips (10, 20). The molding compound structure 38 is composed of a molding compound, which is a material that can be molded to provide a passivation structure that prevents ingress of moisture or impurity into the array of the interposer units 40. Molding compounds are typically composite materials consisting of, but are not limited to, epoxy resins, phenolic hardeners, silicas, catalysts, pigments, and mold release agents. The molding compound structure 38 and the first and second semiconductor chips (10, 20) encapsulate the array of interposer units 40. The array of the first solder balls 60 and the array of the second solder balls 70 can be embedded in the molding compound structure 38.

Sidewalls of each interposer unit 40 can contact the molding compound structure 38, or alternately, a cavity formed between two neighboring interposers 40 that the molding compound fails to fill during formation of the molding compound structure 38.

At least some of the interposer units 40 are formed in alternate configurations. In case alternate configurations are available for an interposer unit 40, at least one alternative interposer unit 40' is provided. The difference between the interposer unit 40 and the at least one alternative interposer unit 40' is in the electrical connection that each makes between the first semiconductor chip 10 and the second semiconductor chip 20.

For example, the first semiconductor chip 10 can include a first semiconductor device (not shown) and a second semiconductor device (not shown) in an area that underlies a slot for the interposer unit 40 or one of the at least one alternative interposer unit 40'. The second semiconductor chip 20 can include a third semiconductor device (not shown) and a fourth semiconductor device (not shown) in an area that overlies the slot for the interposer unit 40 or one of the at least one alternative interposer unit 40'. Use of the interposer unit 40 can conductively connect the first semiconductor device and the third semiconductor device. Use of an alternative interposer unit 40' provides one of many other alternate electrical connections. For example, use of an alternative interposer unit 40' can conductively connect the second semiconductor device and the fourth semiconductor device while not connecting the first or third semiconductor devices, or conductively connect the first semiconductor device to the fourth semiconductor device while not connecting the second or third semiconductor devices, or conductively connect the second semiconductor device to the third semiconductor device while not connecting the first and fourth semiconductor devices, or conductively connect more than two semiconductor devices, or prevent any conductive connection among the four semiconductor devices.

Each of the interposer unit 40 and the at least one alternative interposer unit 40' can provide a unique configuration for electrical connection in which semiconductor devices in the first substrate 10 and semiconductor devices in the second substrate 20 are conductively connected differently. During the assembly of the array of interposer units 40, at least one interposer unit 40 in the array can be selected from a set of at least two interposer units. The set of at least two interposer units includes an interposer unit 40 that is subsequently incorporated in the array and at least one alternative interposer unit 40' that can be, but is not, subsequently incorporated into the array. Each of the at least two interposer units (40, 40') is configured to fit into a same space in the array and provide different configurations in electrical connections through the space.

Once all interposer units 40 for the array are selected, the array of interposer units 40 is assembled. The first semiconductor chip 10 and the second semiconductor chip 20 are bonded to the array of interposer units 40. The molding compound structure 38 is formed to fill the space between the first and second semiconductor chips (10, 20). The molding compound structure 38 and the first and second semiconductor chips (10, 20) can encapsulate the array of interposer units 40.

At least one of the first semiconductor chip 10 and the second semiconductor chip 20 can be tested prior to forming the array of interposer units 40 in order to optimize the selection of the interposer units 40 that are included in the array. In this case, the data from the testing can be employed to select an interposer unit 40 from at least two interposer units (40, 40') for all interposer spaces for which selection among the at least two interposer units (40, 40') is possible.

For example, the assembly of the first semiconductor chip 10 and the second semiconductor chip 20 can be designed to provide a functionality that requires a functional device or module in the first semiconductor chip 10 and another functional device or module in the second semiconductor chip 20. Such functionality can be provided even if not all devices and modules in the first and second semiconductor chips (10, 20) are functional as long as one configuration of the at least two interposer units (40, 40') provides electrical connections that enable the functionality. Such electrical connections can be effected by connecting functional devices or modules, while disabling connection of devices or modules that is known to be non-functional through testing.

Figure 2A:
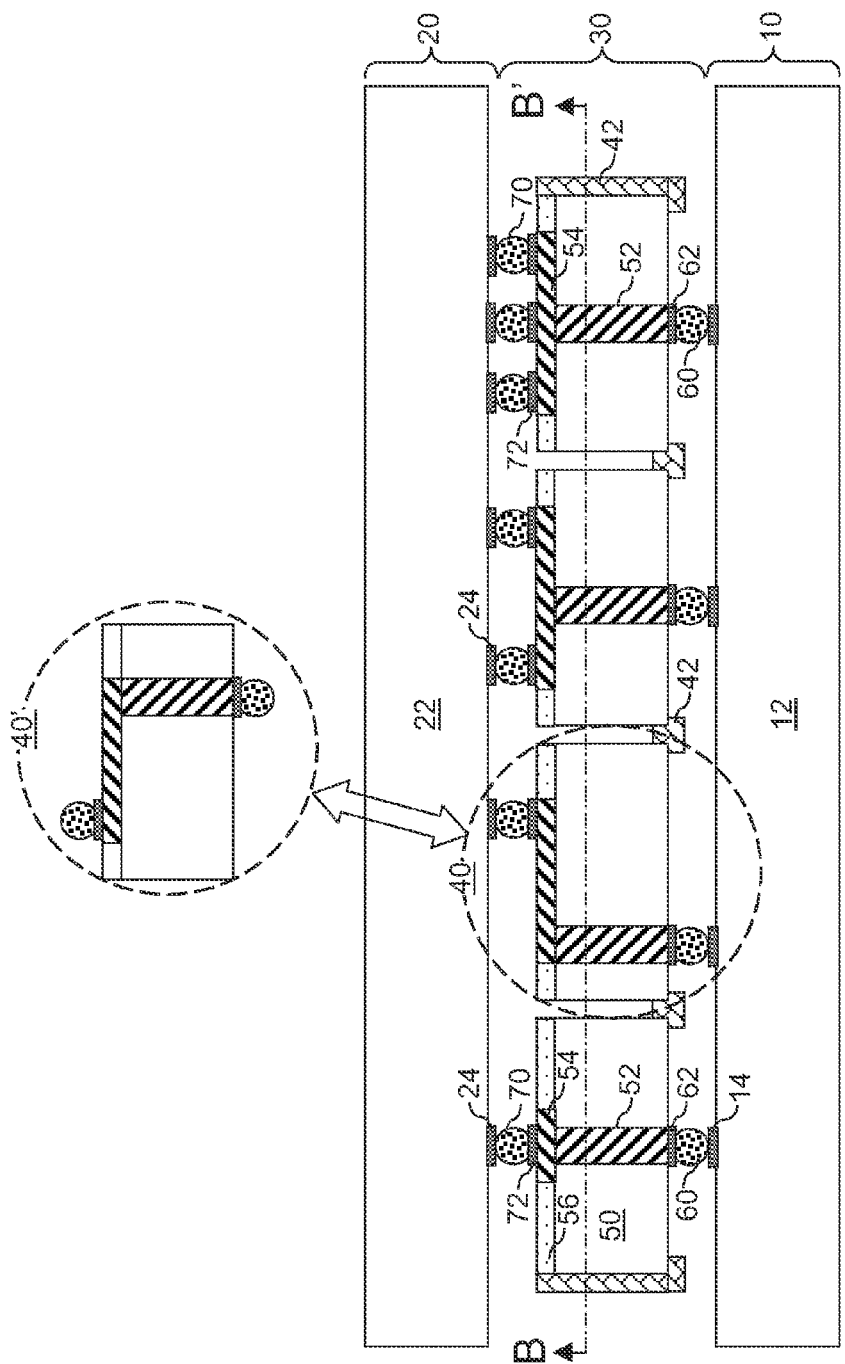
FIG. 2A is a vertical cross-sectional view of a second exemplary structure according to a second embodiment of the present invention.

Referring to FIGS. 2A and 2B, a second exemplary structure according to a second embodiment of the present invention is derived from the first exemplary structure by employing an interposer-frame means and omitting formation of a molding compound structure. The interposer-frame means is employed to hold each interposer unit 40 in the array of interposer units 40 in a fixed position relative to other interposer units 40 in the array. The interposer-frame means can be an interposer frame 42, which ensures that each interposer unit 40 is placed in an optimal position during the assembly of the interposer units 40. The interposer frame 42 can be a frame of dielectric materials in the shape of a crisscross grid. Portions of the interposer frame 42 can have cross-sectional shapes that prevent falling of individual interposer units 40 through a grid. Alternately, the interposer-frame means can be any equivalent structure that can hold each interposer unit 40 in a fixed position relative to other interposer units 40 in the array during assembly. Further, the interposer-frame means can be employed to hold each interposer unit 40 in the array of interposer units 40 in a fixed position relative to other interposer units 40 in the array while the array of interposer units 40 is bonded to the first and second semiconductor chips (10, 20).

Figure 3A:
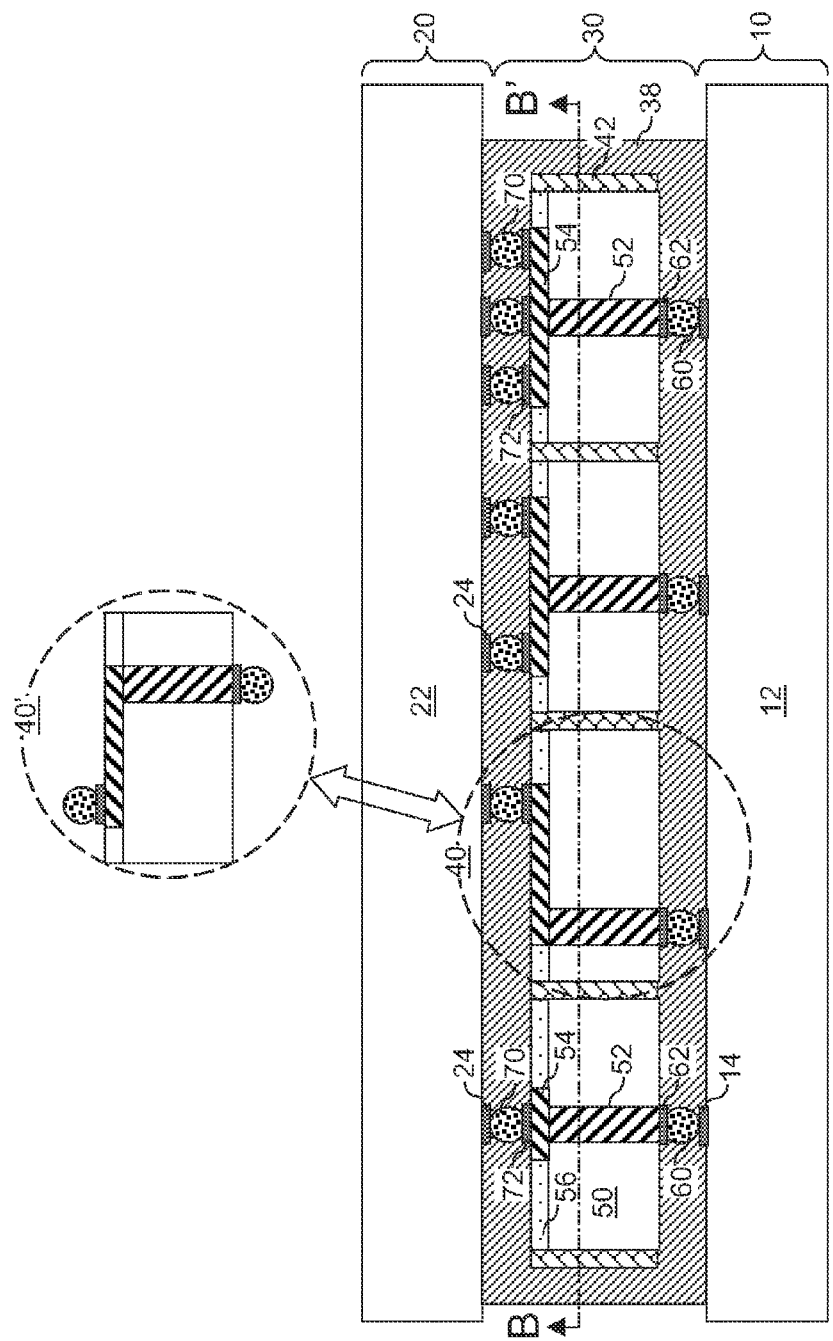
FIG. 3A is a vertical cross-sectional view of a third exemplary structure according to a third embodiment of the present invention.

Referring to FIGS. 3A and 3B, a third exemplary structure according to a third embodiment of the present invention is derived from the second exemplary structure by forming a molding compound structure 38. The molding compound structure 38 can be formed in the same manner as in the first embodiment. For example, the molding compound structure 38 can be formed after the first and second semiconductor chips (10, 20) are bonded employing an interposer-frame means such as the interposer frame 42. The interposer frame 42 is embedded in the molding compound structure 38, which is located between the first and second semiconductor chips (10, 20).

Figure 4A:
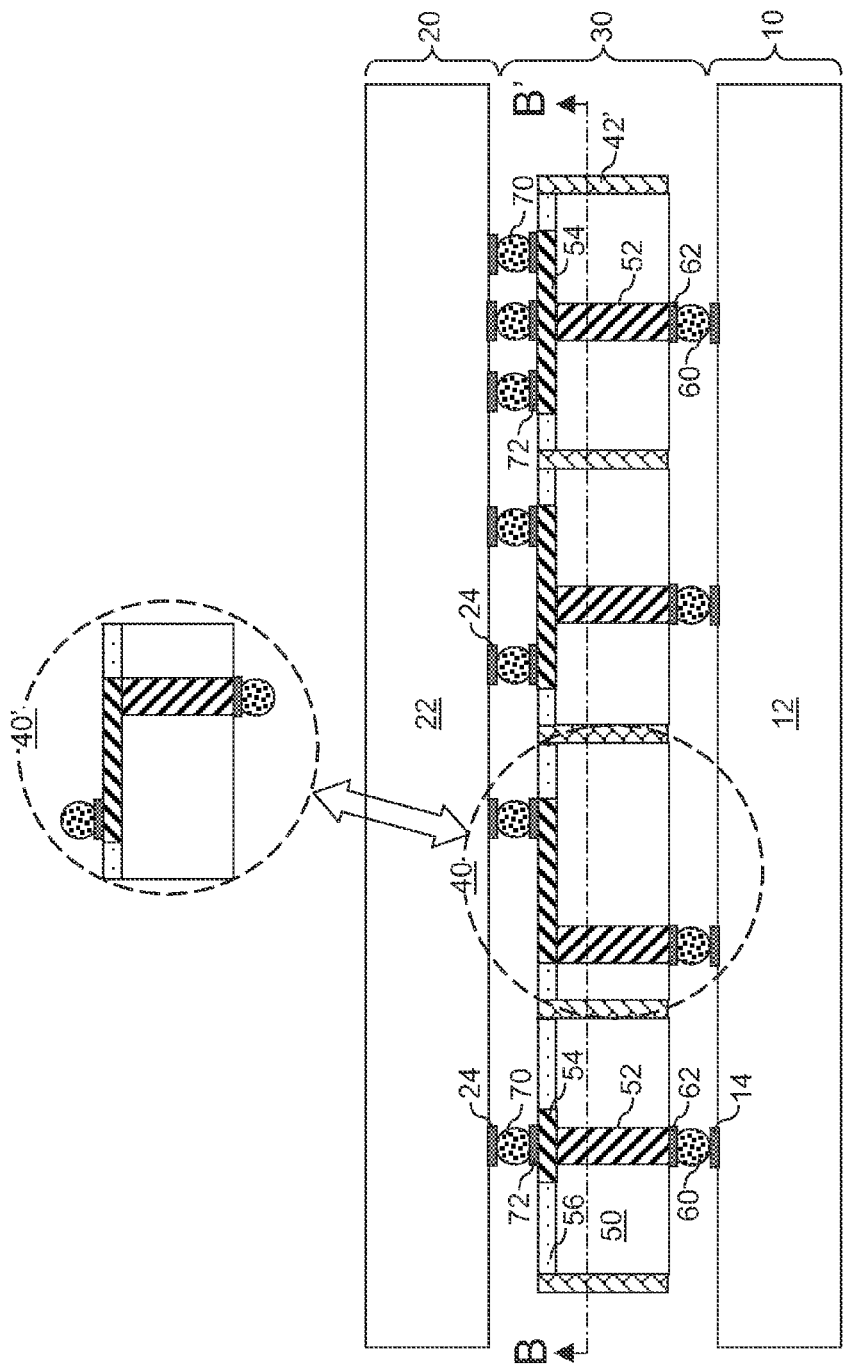
FIG. 4A is a vertical cross-sectional view of a fourth exemplary structure according to a fourth embodiment of the present invention.
Figure 4B:
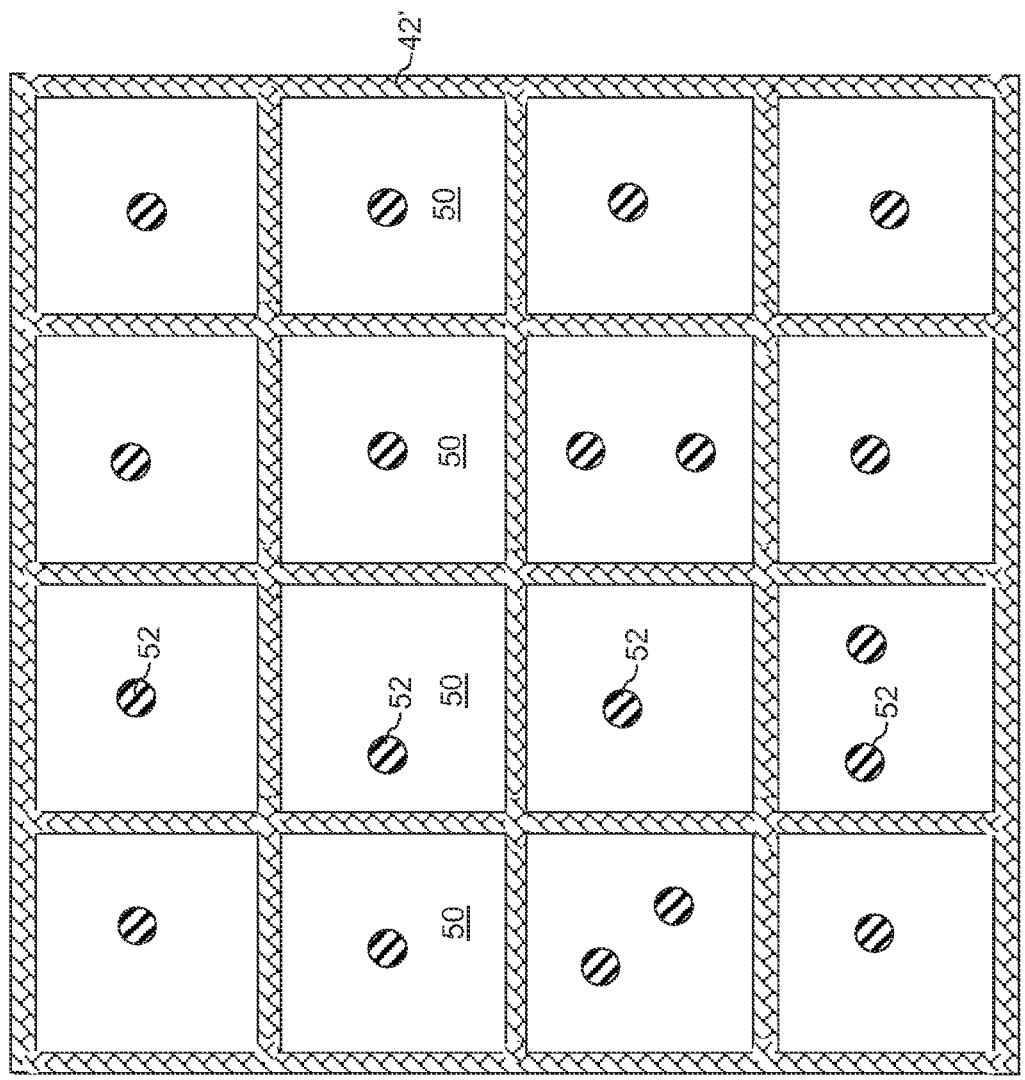
FIG. 4B is a horizontal cross-sectional view of the fourth exemplary structure in the plane B-B' in FIG. 4A according to the fourth embodiment of the present invention.

Referring to FIGS. 4A and 4B, a fourth exemplary structure according to a fourth embodiment of the present invention is formed by employing an interposer frame 42' that provides grids into which each interposer unit 40 fit. All sidewalls of each interposer unit 40 contacts sidewalls of the interposer frame 42'.

Figure 5:
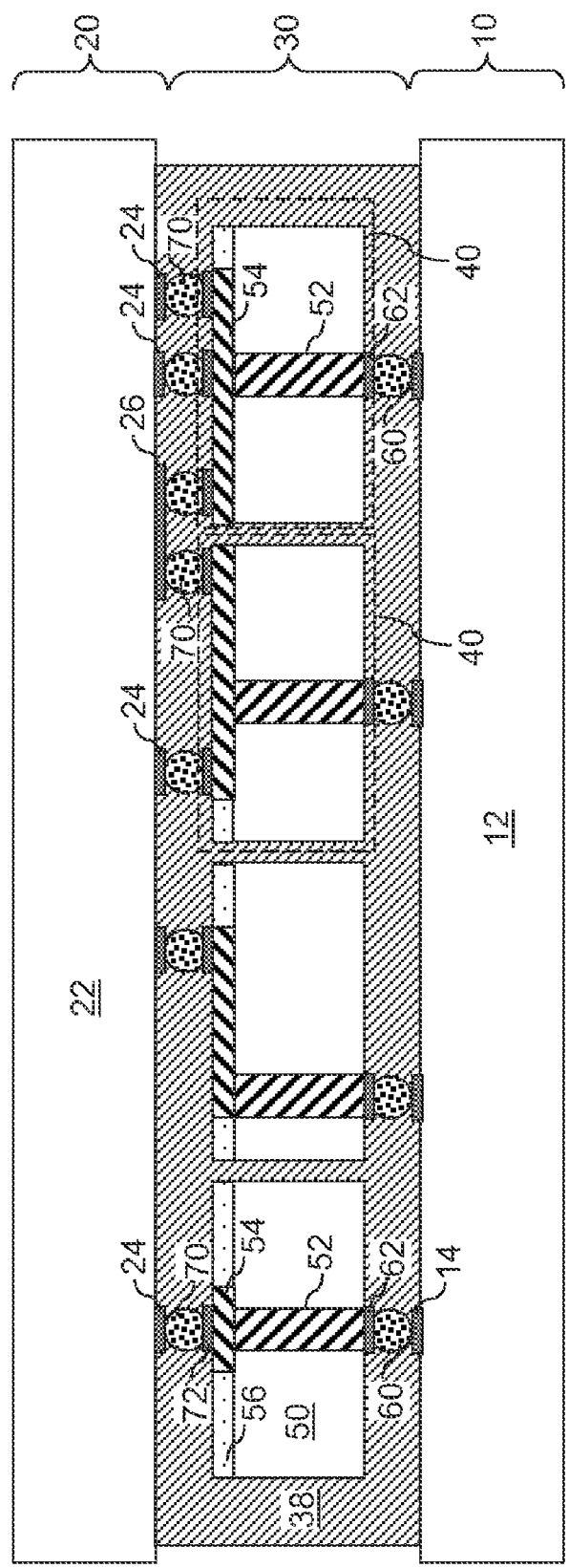
FIG. 5 is a vertical cross-sectional view of a fifth exemplary structure according to a fifth embodiment of the present invention.

Referring to FIG. 5, a fifth exemplary structure according to a fifth embodiment of the present invention can be derived from the first exemplary structure by providing at least one third contact pad 26 located above a peripheral region of an interposer unit 40 and a peripheral region of another interposer unit 40. Two of the second solder balls 70 contact the third contact pad 26 through which electrical connections between two neighboring interconnect structures are conductively connected.

Figure 6:
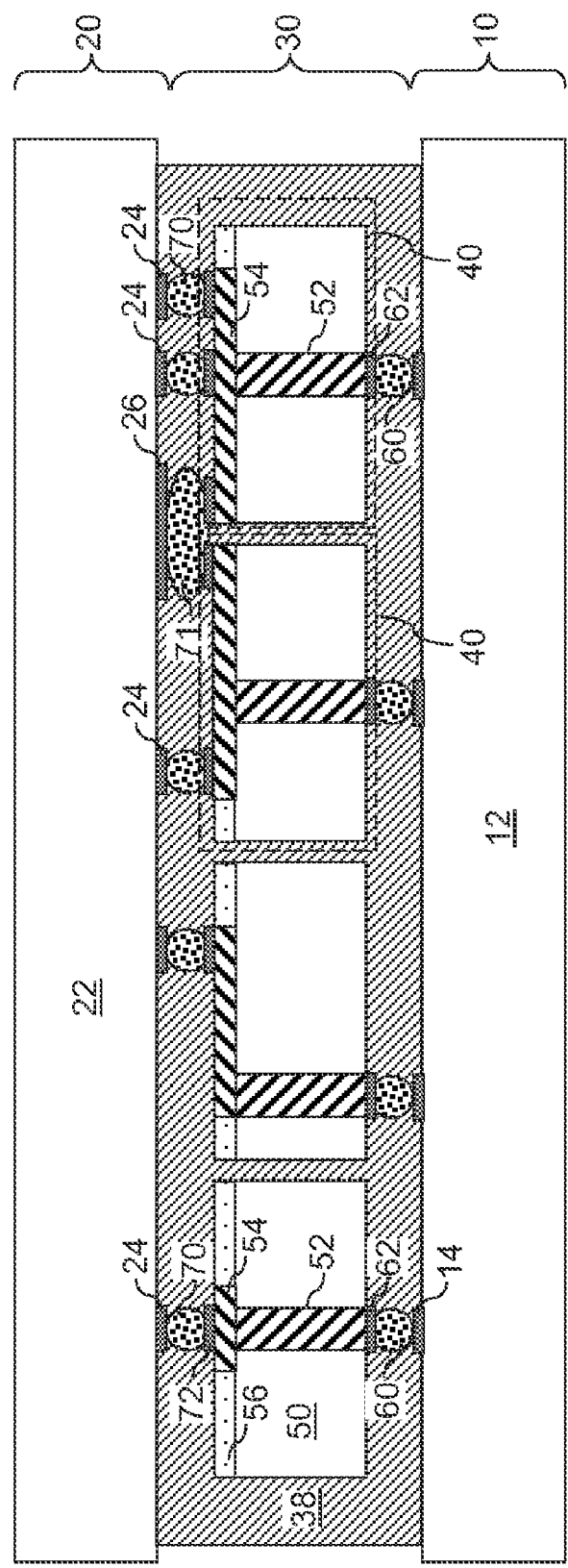
FIG. 6 is a vertical cross-sectional view of a sixth exemplary structure according to a sixth embodiment of the present invention.

Referring to FIG. 6, a sixth exemplary structure according to a sixth embodiment of the present invention is derived from the fifth exemplary structure by providing at least one third solder ball 71. A third solder ball 71 contacts an upper contact pad 72 located on an interposer unit 40, another upper contact pad 72 located on another interposer unit 40, and a third contact pad 26 located on the second semiconductor chip 20. The two upper contact pads 72 that the third solder ball 71 contacts belong to two neighboring interposer units 40. The third solder ball 71 provides a conductive path between the two neighboring interposer units 40, i.e., the two neighboring interposer units 40 are conductively connected.

Figure 7:
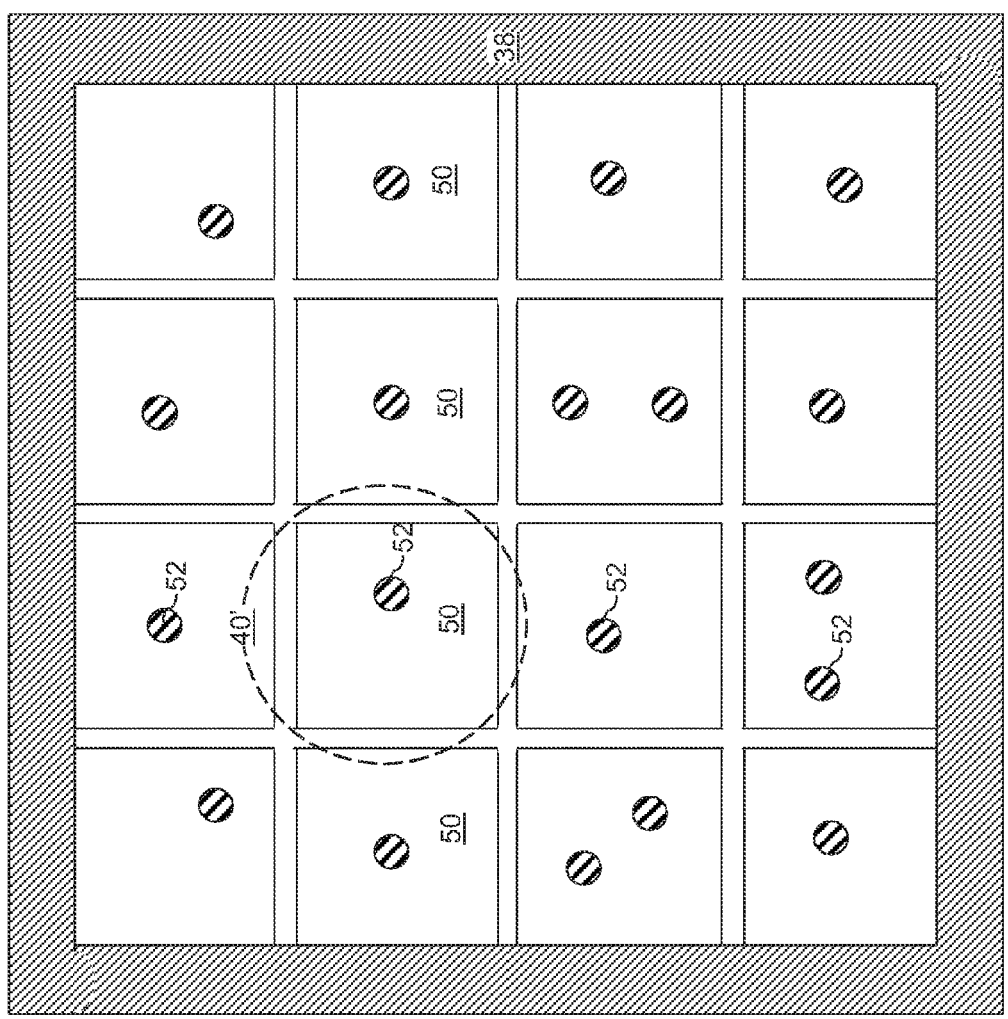
FIG. 7 is a horizontal cross-sectional view of a seventh exemplary structure according to a seventh embodiment of the present invention.

Referring to FIG. 7, a seventh exemplary structure according to a seventh embodiment of the present invention is shown. The seventh exemplary structure is derived from the first exemplary structure by replacing an interposer unit 40 in FIG. 1B with one of the at least one alternative interposer unit 40' that provides a different functional connection than the interposer unit 40 in FIG. 1B. Thus, the seventh exemplary structure is one of the alternate configurations for the first exemplary structure. Alternate configurations can be formed for each of the second through sixth exemplary structures by replacing any one of the interposer units 40 with an alternative interposer unit 40'.

Figure 8:
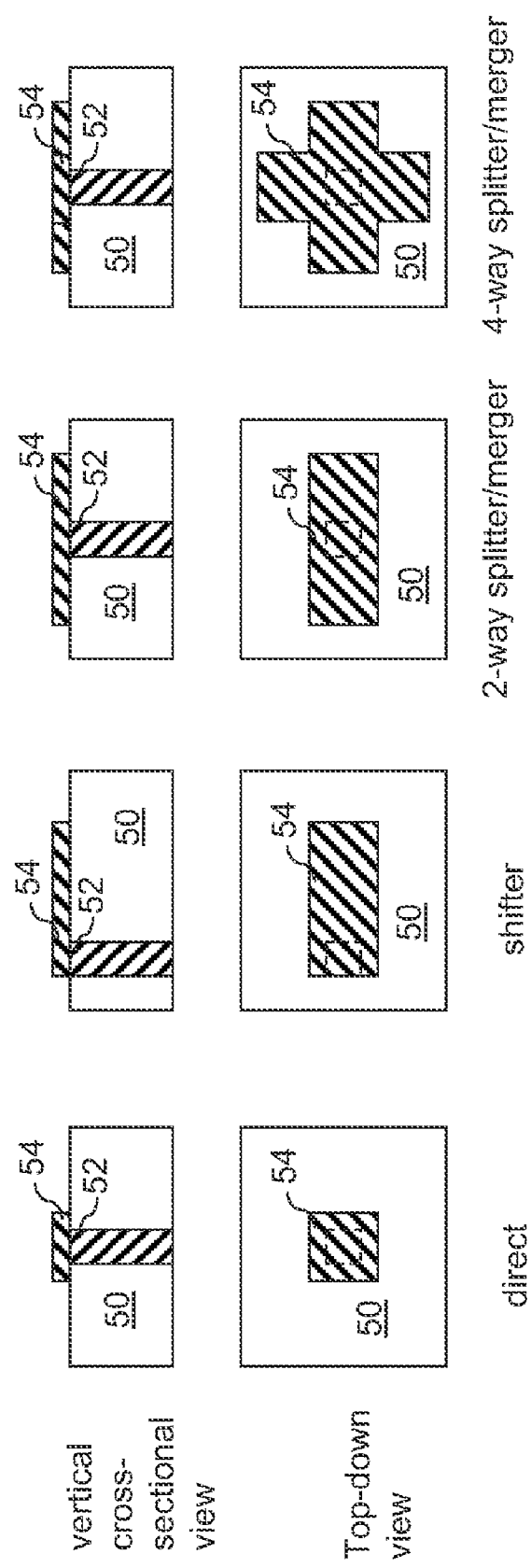
FIG. 8 is a set of vertical cross-sectional views and top-down views of first exemplary interposer units according to an eighth embodiment of the present invention.

Referring to FIG. 8, a set of vertical cross-sectional views and top-down views of first exemplary interposer units is illustrated according to an eighth embodiment of the present invention. Upper contact pads, lower contact pads, and a dielectric material layer can be present, but are not shown for clarity in the drawings. First interposer units can be provided in any geometry that enables electrical connection between a first semiconductor chip and a second semiconductor chip. While each of the first interposer units illustrated in FIG. 8 include only one TSV structure 52, interposer unit can include no more than one TSV structure or at least two TSV structures. A first interposer unit can, but does not need to, include at least one conductive metal line 54, which can be no more than one conductive metal line 54 or at least two conductive metal lines 54. Each of the at least one conductive metal line 54 contacts at least one TSV structure 52. A first interposer unit can be employed in any of the first through seventh exemplary structures as an interposer unit 40 or an alternative interposer unit 40'.

Figure 9:
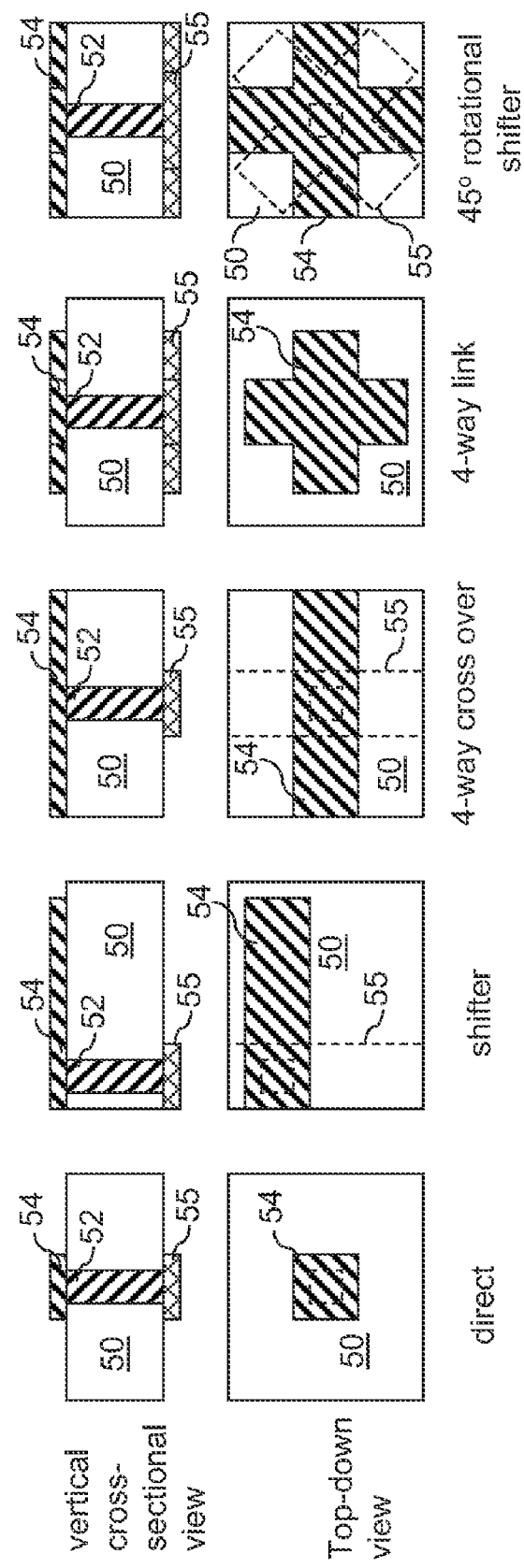
FIG. 9 is a set of vertical cross-sectional views and top-down views of second exemplary interposer units according to a ninth embodiment of the present invention.

Referring to FIG. 9, a set of vertical cross-sectional views and top-down views of second exemplary interposer units is illustrated according to a ninth embodiment of the present invention. Upper contact pads, lower contact pads, and dielectric material layers can be present, but are not shown for clarity in the drawings. Each second interposer unit can have all of the elements of a first interposer unit. In addition, each second interposer unit includes at least one additional conductive metal line 55 located on an opposite side of the at least one conductive metal line 54. The dielectric material layers, if present, are located in the same level as at least one conductive metal line 54 and/or at least one additional conductive metal line 55. The at least one additional conductive metal line 55 provides additional versatility in electrical wiring provided by second interposer units. A second interposer unit can be employed in any of the first through seventh exemplary structures as an interposer unit 40 or an alternative interposer unit 40'.

Referring to FIG. 10A, an eighth exemplary structure according to a tenth embodiment of the present invention includes a substrate 50L and a patterned photoresist 57 formed on a top surface of the substrate 50L. The substrate 50L can be a dielectric material, a semiconductor material, a conductive material, or a combination thereof. Trenches are etched in the substrate 50L by an anisotropic etch that employs the patterned photoresist 16 as an etch mask. The patterned photoresist 57 is subsequently removed.

Referring to FIG. 10B, embedded conductive structures 52P are formed in the substrate 50L by filling the trenches with a conductive material. Excess conductive material can be removed from above the top surface of the substrate SOL by a recess etch or chemical mechanical planarization (CMP). If the substrate SOL includes a semiconductor material or an insulator material, a dielectric liner (not shown) is formed on sidewalls of the trenches to provide electrical isolation of the embedded conductive structures 52P from the substrate 50L.

Referring to FIG. 10C, the substrate 50L is thinned by removing a lower portion of the substrate 50L, for example, by back-side grinding. The embedded conductive structures 52P extend from the top surface of the substrate 50L to the bottom surface of the substrate 50L, thereby constituting a plurality of through-substrate via (TSV) structures 52.

Referring to FIG. 10D, a metal layer 54L is formed on the top surface or the bottom surface of the substrate 50L.

Referring to FIG. 10E, a plurality of conductive metal lines 54 are formed on the substrate 50L by patterning the metal layer 54L. Each of the plurality of conductive metal lines 54 contacts a TSV structure 52. The substrate 50L is diced to form a plurality of interposer units, for example, along the dotted lines. Subsequently, some of the plurality of interposer units can be placed in proximity to one another to form an array of interposer units as described above.

Referring to FIG. 11A, a ninth exemplary structure according to an eleventh embodiment of the present invention includes a substrate SOL and a patterned photoresist 57 formed on a top surface of the substrate 50L. The substrate 50L can be a dielectric material, a semiconductor material, a conductive material, or a combination thereof. Trenches are etched in the substrate 50L by an anisotropic etch that employs the patterned photoresist 16 as an etch mask. The patterned photoresist 57 is subsequently removed.

Referring to FIG. 11B, embedded conductive structures 52P are formed in the substrate 50L by filling the trenches with a conductive material. Excess conductive material can be removed from above the top surface of the substrate SOL by a recess etch or chemical mechanical planarization (CMP). If the substrate SOL includes a semiconductor material or an insulator material, a dielectric liner (not shown) is formed on sidewalls of the trenches to provide electrical isolation of the embedded conductive structures 52P from the substrate 50L. A metal layer 54L is formed on the top surface of the substrate 50L.

Referring to FIG. 11C, a plurality of conductive metal lines 54 are formed on the substrate 50L by patterning the metal layer 54L. The substrate 50L is thinned by removing a lower portion of the substrate 50L, for example, by back-side grinding. The embedded conductive structures 52P extend from the top surface of the substrate 50L to the bottom surface of the substrate SOL, thereby constituting a plurality of through-substrate via (TSV) structures 52.

Referring to FIG. 11D, a second metal layer 64L is formed on the bottom surface of the substrate 50L.

Referring to FIG. 11E, a plurality of second conductive metal lines 64 are formed on the bottom surface of the substrate 50L by patterning the second metal layer 64L. Each of the plurality of second conductive metal lines 64 contacts a TSV structure 52. The substrate 50L is diced to form a plurality of interposer units, for example, along the dotted lines. Subsequently, some of the plurality of interposer units can be placed in proximity to one another to form an array of interposer units as described above.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A semiconductor structure comprising:
   an array of interposer units, wherein at least one interposer unit in said array is conductively connected to a first semiconductor chip and a second semiconductor chip, and each interposer unit in said array is not of integral construction with any other interposer unit in said array;
   first solder balls and second solder balls, wherein each of said first solder balls contacts a lower contact pad of an interposer unit and a first contact pad of said first semiconductor chip, and each of said second solder balls contacts an upper contact pad of said interposer unit and a second contact pad of said second semiconductor chip; and
   an interposer-frame means for holding each interposer unit in said array of interposer units in a fixed position relative to other interposer units in said array, wherein said interposer-frame means is embedded in a molding compound structure located between said first and second semiconductor chips.

2. The semiconductor structure of claim 1, wherein said interposer unit in said array includes a through-substrate via (TSV) structure embedded in an interposer substrate, an upper contact pad located on one side of said interposer substrate, and a lower contact pad located on another side of said interposer substrate.

3. The semiconductor structure of claim 2, wherein said interposer unit in said array further includes a conductive metal line contacting said upper contact pad and one end of said TSV structure.

4. The semiconductor structure of claim 1, further comprising a molding compound structure located between said first and second semiconductor chips, wherein said molding compound structure and said first and second semiconductor chips encapsulate said array of interposer units.

5. The semiconductor structure of claim 1, wherein said first and second solder balls are embedded in a molding compound structure located between said first and second semiconductor chips.

6. The semiconductor structure of claim 1, wherein sidewalls of said interposer unit contact a molding compound structure or a cavity located between two neighboring interposers.

7. The semiconductor structure of claim 1, further comprising a third solder ball contacting an upper contact pad located on said interposer unit, another upper contact pad located on another interposer unit, and a third contact pad located on said second semiconductor chip.

8. A method of forming an array of interposer units, said method comprising:

forming a plurality of through-substrate via (TSV) structures in a substrate;

forming a plurality of conductive metal lines contacting a TSV structure on one side of said substrate;

dicing said substrate to form a plurality of interposer units, wherein at least one of said plurality of interposer units includes no more than one TSV structure; and placing some of said plurality of interposer units in proximity to one another to form an array of interposer units.

9. The method of claim 8, wherein said array of interposer units is formed by selecting an interposer unit in said array from a set of at least two interposer units, wherein each of said at least two interposer units is configured to fit into a same space in said array and provide different configurations in electrical connections therethrough.

10. The method of claim 8, further comprising employing an interposer-frame means to hold each interposer unit in said array of interposer units in a fixed position relative to other interposer units in said array.

11. The method of claim 8, further comprising forming another plurality of conductive metal lines contacting a TSV structure on another side of said substrate before dicing said substrate.

* * * * *